United States Patent [19]
Yap

[11] Patent Number: 5,895,481
[45] Date of Patent: Apr. 20, 1999

[54] PROGRAMMABLE VESA UNIFIED MEMORY ARCHITECTURE (VUMA) ROW ADDRESS STROBE (RAS)

[75] Inventor: Kok-Kean Yap, Milpitas, Calif.

[73] Assignee: Cypress Semiconductor Corp., San Jose, Calif.

[21] Appl. No.: 08/651,370

[22] Filed: May 22, 1996

[51] Int. Cl.$^6$ .............................. G06F 12/02; G11C 7/00; G11C 8/00

[52] U.S. Cl. .............................. 711/5; 711/202; 711/148; 711/105; 395/299; 365/193; 365/230.02; 365/230.06

[58] Field of Search .............................. 711/5, 202, 148, 711/105; 395/293, 299; 365/193, 230.02, 230.06

[56] References Cited

U.S. PATENT DOCUMENTS

| | | | |
|---|---|---|---|
| 5,005,157 | 4/1991 | Catlin | 365/193 |
| 5,414,670 | 5/1995 | Schaefer | 365/230.03 |
| 5,613,094 | 3/1997 | Khan et al. | 711/5 |

OTHER PUBLICATIONS

VUMA Standard—Hardware Specifications, Video Electronics Association, Version 1.0, Mar. 1996.

*Primary Examiner*—Reginald G. Bragdon
*Attorney, Agent, or Firm*—Maiorana & Acosta, P.C.

[57] ABSTRACT

A memory controller is disclosed for use in physically mapping a VESA Unified Memory Architecture (VUMA) device, Row Address Strobe signal RAS# to a selected one of a plurality of memory banks. The RAS# signal from the VUMA device is routed to the memory controller, not the memory bank directly. The memory controller employs a network of pass gates to provide an electrically-conductive channel for routing the VUMA device RAS# signal to the appropriate memory bank. The appropriate pass gate is caused to become conductive through the use of a decoder, and a 3-bit clocked register bank. The register bank is programmable to generate a select signal on its output that is representative of the desired memory bank to receive the VUMA device RAS# signal. The select signal, which is a 3-bit signal, is provided to the decoder, which activates one of its plurality of output lines to thereby cause the selected pass gate to conduct. Through this conductive path, the RAS# signal can be routed to the desired memory bank for access to data stored therein.

23 Claims, 3 Drawing Sheets

PROGRAMMABLE VESA UNIFIED MEMORY ARCHITECTURE (VUMA) ROW ADDRESS STROBE (RAS)

BACKGROUND OF THE INVENTION

1. Field of the Invention

The present invention relates generally to systems for supporting VUMA devices, and, more particularly, to a system for physically mapping a Row Address Strobe (RAS) signal from a VUMA device to an appropriate memory bank of a system memory.

2. Description of the Related Art

The Video Electronics Standards Association (VESA) has been active in promulgating various standards relating to computer architectures, and in particular, has investigated a Unified Memory Architecture. The concept of a VESA Unified Memory Architecture (VUMA) is to share physical system memory, for example one or more banks of dynamic random access memory (DRAM), between the system (e.g., a CPU), and an external device—a so-called VUMA device. Such a device could be any type of controller that has a need to share physical system memory, and in the course of such sharing, directly access it. For example, one type of VUMA device may be a graphics controller, wherein such graphics controller may incorporate its graphics frame buffer in physical system memory, thus eliminating the necessity for a separate graphics memory.

Memory sharing is achieved by physically connecting a core logic chip set (hereinafter "core logic"), and the VUMA device to the same physical system memory, either directly on a motherboard, or by way of an expansion connector. Since the core logic, and the VUMA device share a common resource, arbitration is required therebetween for controlled operation. For example, in one configuration, the core logic is the default owner of the physical system memory, such ownership being transferrable to the VUMA device upon demand according to a protocol.

The physical system memory may contain a memory block allocated primarily for the VUMA device (hereinafter referred to as "main VUMA memory"). Main VUMA memory is preferably located in an uppermost block of a memory bank. The VUMA device may be connected to the physical system memory to access main VUMA memory in one of two ways. First, the VUMA device may be connected to a single memory bank of physical system memory wherein the VUMA device generates a single VUMA row address strobe signal (VRAS#), which is hardwired to the selected memory bank. Secondly, the VUMA device may be configured to access all of physical system memory wherein the VUMA device has a sufficient number of RAS# signals to access all of the memory banks in the physical system memory. Preferably, main VUMA memory needs to be mapped at the top of existing physical system memory for any particular configuration.

For the VUMA device of the type which can access only one memory bank, a problem arises when physical system memory is expanded. In particular, for example, assume that an initial system configuration includes a single bank of memory having 8 MB of memory total, wherein one MB is allocated to main VUMA memory. In such a configuration, the VUMA device is hardwired to the single memory bank. Thus, main VUMA Memory occupies physical memory from addresses 7M to 8M-1. When physical system memory is expanded to, for example, 16 MB by adding a second memory bank of 8 MB memory, a "hole" in the physical system memory, as viewed by the operating system software, is created. That is to say, under such conditions, the operating system software has access to memory from 0M. to 7M-1, and, from 8M. to 16M-1; the operating system software is not permitted to access addresses 7M to 8M-1 since this 1 MB block has been reserved for, and is accessible by, the VUMA device. Operating system software has some difficulty in dealing with this "hole" (i.e., an address space that is non-contiguous) and this fact is the reason why main VUMA memory is preferably mapped to the top of existing physical system memory (i.e., to eliminate the "hole" seen by the operating system software, since all low memory will be contiguous).

Three solutions for this problem have been proposed. One solution suggests that main VUMA memory be mapped non-contiguously with respect to the operating system memory. In particular, core logic (e.g., typically a memory controller device) maps main VUMA memory to an address beyond core logic's possible physical system memory range. Hence, even if physical system memory is expanded to the maximum possible size, there will be no "hole" in the memory as seen by the operating system software. For example, in a system where physical system memory may be expanded only to 64 MB, core logic may map main VUMA memory from 1G to 1G+1M-1. This solution, however, requires a moderate amount of hardware modification to the memory controller, as well as moderate amount of modification to the basic input/output (BIOS). In addition, the method is not independent of SIMM density.

Another solution involves mapping main VUMA memory contiguously with operating system memory. In particular, core logic maps main VUMA memory to the top of the logical address space, although, in the physical system memory space, the main VUMA memory may occupy a middle region. For example, assume that a one-bank system of 8 MB is expanded to a 16 MB two-bank system. The main VUMA memory would be mapped to addresses 15M to 16M-1; however, physically, this memory occupies a region physically between 0.S. memory spaces. This solution, however, has several disadvantages, including a moderate amount of hardware modification to the memory controller, as well as intensive BIOS modifications.

A third solution involves swapping the memory bank which contains main VUMA memory originally with the uppermost bank then-existing after expansion. That is, core logic swaps the memory bank containing main VUMA memory to the top of the memory space. Thus, although main VUMA memory is mapped "contiguously" (e.g., it is at the top of the logical address space as seen by the operating system software, and contiguous to the operating system software memory space), the solution has several disadvantages including, requiring an intensive amount of memory controller hardware modification to perform the bank switching, as well as a moderate amount of BIOS modifications.

Accordingly, there is a need to provide an improved system for defining a memory space for a VUMA device that minimizes or eliminates one or more of the problems as set forth above.

SUMMARY OF THE INVENTION

One advantage of the present invention is that it requires only a minimum amount of hardware modification to core logic (e.g., the memory controller device). Another advantage of this invention is that it requires only a minimum amount of BIOS (e.g., firmware) modification. Yet another advantage of the present invention is that the hardware modifications do not insert a gate delay in the propagation of an RAS# signal. Finally, the structure of one preferred embodiment provides built-in termination capabilities, thus minimizing the need for external termination resistors.

These and other features and advantages are obtained by coupling a device RAS# signal (such as a VUMA device RAS# signal VRAS# in a preferred embodiment) to a memory controller, rather than hardwired to a default memory bank, and further, including in tile memory controller structure sufficient to map the device RAS# signal to a desired memory bank, on a programmable basis. A preferred embodiment of this invention is suitably adapted for use in a system having a plurality of memory banks wherein each memory bank is responsive to a respective memory row address strobe (RAS#) signal for access to data stored therein. Such an embodiment generally provides the function of mapping a device RAS# signal (such as from a VUMA device) to a selected one of the memory banks. The embodiment according to the invention includes means, such as a bank select register, for generating a select signal representative of the one memory bank selected to receive the device RAS# signal, and means for selectively mapping the device RAS# signal to the selected memory bank according to the generated select signal.

The bank select register comprises a programmable input, accessible and modifiable by way of BIOS, for varying the selection of the memory bank selected to receive the device RAS# signal. The mapping means may, in one embodiment, comprise a decoder circuit responsive to the select signal, and a plurality of pass gates. The decoder circuit is provided for activating one of a plurality of decoder outputs according to the select signal. Each pass gate has a first terminal connected to the device RAS# signal, a second terminal respectively coupled to the memory banks, and a control gate respectively coupled to the decoder circuit outputs. In operation, one of the pass gates is operative to transfer the device RAS# signal to the selected memory bank according to the select signal. The amount of hardware modification to the memory controller is relatively small. BIOS modifications are likewise small. Moreover, the technique minimizes the need for external termination resistors because the pass gate resistance also provides the function of a termination resistor.

Other objects, features, and advantages of the present invention will become apparent to one skilled in the art from the following detailed description and accompanying drawings illustrating features of this invention by way of example, but not by way of limitation.

DETAILED DESCRIPTION OF THE PREFERRED EMBODIMENTS

Figure 1A:
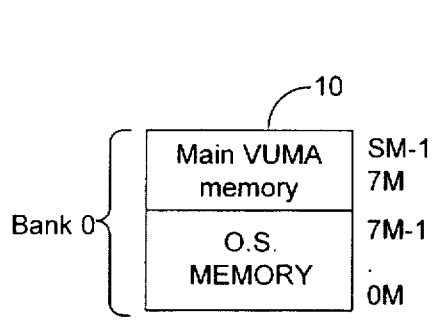
FIG. 1A is a diagrammatic view illustrating the physical system memory before expansion.

Referring now to the drawings wherein like reference numerals are used to identify identical components in the various views, FIG. 1A is a diagrammatic view of a memory bank 10 of a physical system memory prior to expansion. As discussed in the Background section, main VUMA memory occupies the uppermost portion of the memory bank, while the remainder of the memory bank is allocated to operating system (OS) memory. In the illustrated memory bank 10, 1M byte of memory has been allocated for main VUMA memory.

Figure 1B:
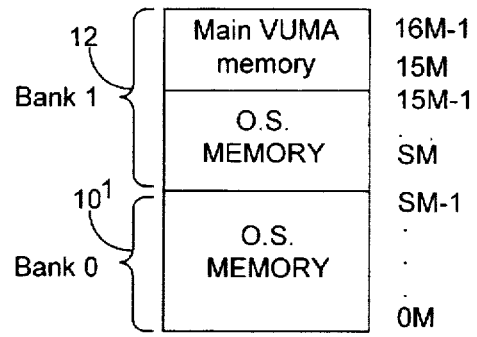
FIG. 1B is a diagrammatic view illustrating physical system memory shown in FIG. 1A, after expansion, wherein main VUMA memory has been mapped contiguous with operating system memory space, and to the uppermost addresses of physical system memory.

FIG. 1B is a diagrammatic view of physical system memory after expansion according to the present invention, wherein main VUMA memory has been physically mapped contiguously to the operating system memory, and, as required, occupies the uppermost portion of the physical memory space. The physical system memory includes an exemplary memory bank 10', and a second memory bank 12. These banks are also identified as memory bank 0, and memory bank 1, respectively.

Before proceeding to a detailed description of the structure and methodology according to the present invention referenced to the drawings, a description of the inventive control established by the present invention will be set forth. With reference to FIGS. 1A, and 1B, it should be appreciated that the operating system memory has no "holes." That is, the logical memory space, as seen by the operating system, is contiguous. It should be further appreciated that the physical memory space set aside as main VUMA memory no longer occupies (nor is constrained to occupy by the hardwired RAS# signal) the uppermost memory space of bank 0, as in certain ones of the conventional approaches described in the Background section. Unlike the conventional VUMA device, which may have its RAS# signal hardwired to a default one of the memory banks, and thus invariant to changes/expansion of the real memory in the system, the present invention provides the means wherein the RAS# signal generated by the VUMA device is electrically routed to a preselected one of the memory banks so as to establish a contiguous memory space, as seen by the operating system, and, in addition still meet the requirement that the main VUMA memory be mapped to the top of memory. It accomplishes this function by routing the VUMA RAS# signal flexibly through a memory controller rather than directly to the default memory bank. It should be understood that the VUMA device, although referred to at times as an exemplary graphics controller, may be any type of device having a need to share physical system memory, as explained in the VUMA specification.

Figure 2:
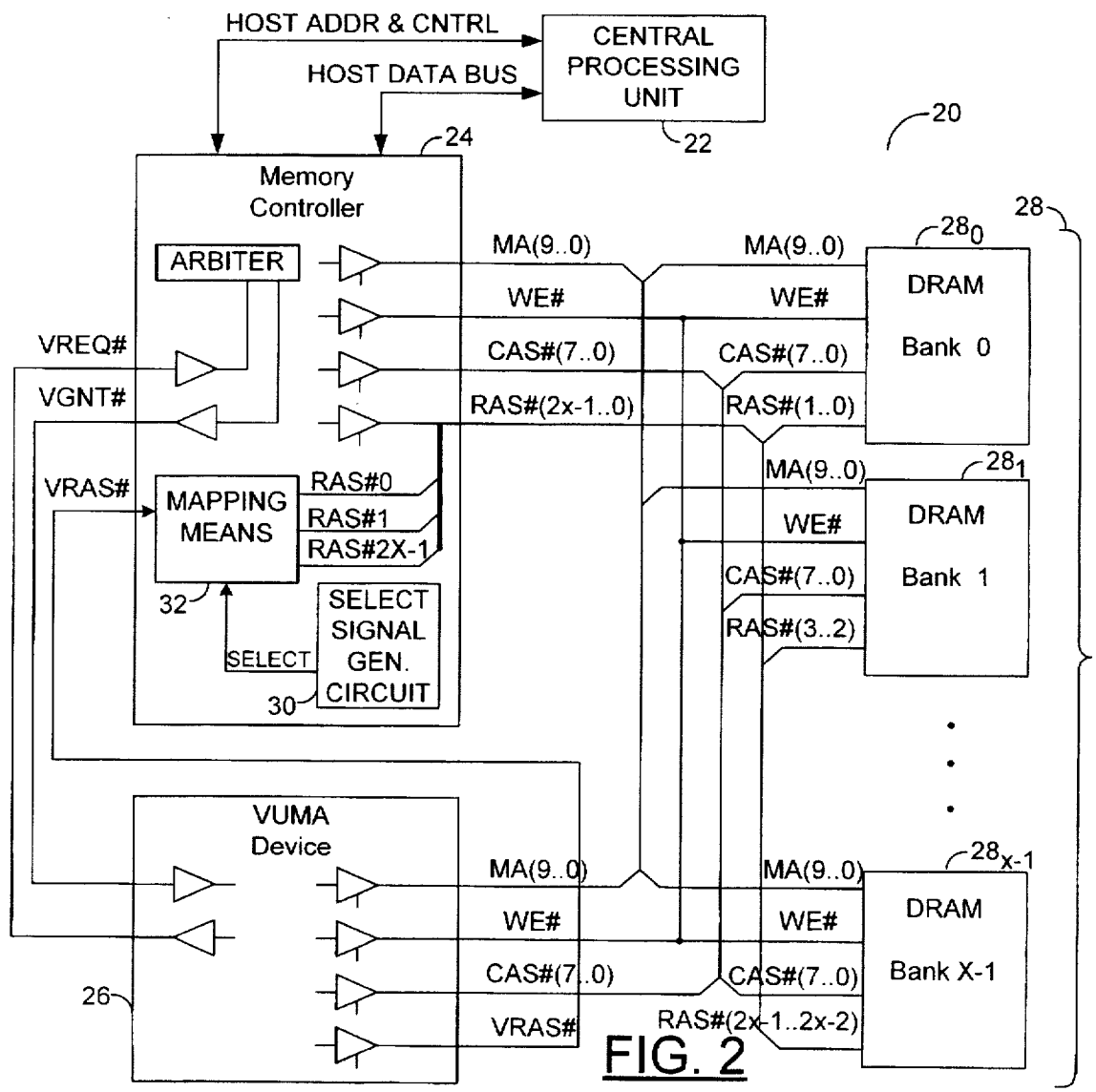
FIG. 2 is a simplified, schematic and block diagram view illustrating a preferred embodiment of the present invention.

FIG. 2 illustrates one preferred environment in which the structure and methodology of the present invention may be profitably employed. System 20 includes a central processing unit 22, a core logic chip set, which may include a memory controller 24, a VESA Unified Memory Architecture (VUMA) device 26, such as, for example, a graphics controller, and a physical system memory 28, which comprises a memory bank 0 indicated at $28_0$ and which may include a plurality of such memory banks, indicated as $28_0$, $28_1$, ...., $28_{x-1}$.

Central processing unit 22 may take the form of any one of a number of commercially available processing units such as, for example only, an Intel Pentium ( D microprocessor, or any pentium-class CPU. In the context of the present invention, the function, and structure of CPU 22 is well-known, and conventional in the art, and, accordingly, will not be discussed in any further detail. CPU 22 is connected to memory controller 24 by conventional means, such as a host address and control bus, and a host data bus.

One function performed by memory controller 24 includes controlling the access of CPU 22 to the physical system memory 28. Furthermore, since VUMA device 26 shares, in the illustrated embodiment, the same memory connections with memory controller 24, (i.e., they share a common resource), the devices must arbitrate for control of the memory 28. Memory controller 24 may also perform the arbitration function amongst various contenders for memory 28. As background, according to the VUMA protocol, the VUMA device 26 arbitrates with the memory controller 24 for access to the shared physical system memory 28 through a multiple-signal arbitration scheme, which signals includes a memory request signal VREQ#, and memory grant signal VGNT#. The VUMA device 26 will assert the VREQ# signal when it desires access to memory 28, and will assume ownership of the memory access and control lines upon receipt of an activated memory grant signal VGNT# from memory controller 24. The protocol relating to the request and grant of access to the memory, as well as issues related to synchronization, priority levels, preemption, and the like are beyond the scope of the present invention, and are left to the reader to the extent of their interest. In this connection, Applicant hereby refers to the Video Electronics Standards Association (VESA) draft proposal entitled "VESA Unified Memory Architecture," hardware specification proposal version 1.0p, dated Oct. 31, 1995 available from the Video Electronics Standards Association, 2150 North First Street, Suite 440, San Jose, Calif. hereby incorporated by reference herein.

Memory controller is connected to the plurality of memory banks $28_0, 28_1, \ldots, 28_{x-1}$ by a plurality of memory control, address, and data (not illustrated) lines. In particular, FIG. 2 illustrates various address and control signals as follows, wherein a pound symbol ("#") indicates that the signal is an active low type:

MA [9..0] Multiplexed memory address signals. These signals are shared by memory controller 24, and VUMA device 26. These signals are driven by the current bus master. Although ten (10) bits are illustrated, more or less lines may be provided, depending on the memory configuration so used.

WE# Active low write enable. This signal is shared by memory controller 24, and VUMA device 26. It is driven by the current bus master.

CAS# [7..0] Active low column address strobe, one for each byte lane. For example, for a pentium-class system, eight (8) lines are provided. However, depending on the system, more or less lines may be provided. These signals are shared by memory controller 24, and VUMA device 26. They are driven by the current bus master.

RAS# [2X-1..0] Active low row address strobe for the memory banks. Memory controller 24 will provide a plurality of RAS#s lines to support a corresponding plurality of memory banks $28_0, 28_1, \ldots, 28_{x-1}$. VUMA device 26 is illustrated as having a single row address strobe signal indicated as VRAS#. These signals are shared by memory controller 24, and VUMA device 26, in a manner to be described in further detail hereinafter. These signals are driven by the current bus master. It should be understood that although the illustrated embodiment shows two (2) RAS# lines per memory bank, variations are possible, depending on the memory configuration.

The above-identified signals are well-known to those of ordinary skill in the art, and will not be further elaborated upon.

Memory controller 24 includes means, such as select signal generating circuit 30, for generating a select signal SELECT representative of a memory bank selected to receive the VUMA device row address strobe signal VRAS#, and, means, such as mapping means 32, for selectively mapping the VRAS# signal to the selected memory bank $28_i$ according to the select signal SELECT. That is, in order to obtain the contiguous physical mapping illustrated in FIGS. 1A, and 1B, one of the memory banks $28_0, 28_1, \ldots, 28_{x-1}$ in which the VUMA device memory space (e.g., main VUMA memory) is desired to be defined must be selected. This selecting step may include the substep of defining, as described above, the main VUMA memory space to be contiguous with an operating system memory space, and wherein the main VUMA memory is located in a highest available region of memory 28. These steps may be performed by BIOS routines, based upon information available to the BIOS regarding changes/expansions to the physical system memory configuration. In particular, when additional memory banks are added, the BIOS can be programmed to determine the post-expansion configuration and, upon boot up, and as part of its setup procedure, program or configure circuit 30 to generate an appropriate select signal. Such SELECT signal may then be operative to control the mapping means 32 to electrically route the VUMA device RAS# signal, VRAS#, to the selected memory bank $28_i$ for use as a memory RAS# signal for the selected memory bank. These steps thereby establish main VUMA memory in the desired memory bank to satisfy the above-indicated criteria.

VUMA device 26 is any type of controller which needs to share physical system memory with another device, such as CPU 22, and, accordingly, needs direct access thereto. In the preferred embodiment, VUMA device 26 may be a graphics controller 26. It should be understood, however, that VUMA device 26 can be any type of controller with a need to share physical system memory 28, according to the VUMA specification.

In the illustrated embodiment, each memory bank $28_0, 28_1, \ldots, 28_{x-1}$, is shown as receiving two (2) RAS# lines or signals; however, it should be appreciated that there are a plurality of memory configurations which may be used and which fall within the spirit and scope of the present invention. Further, although memory banks $28_0, 28_1, \ldots, 28_{x-1}$ are illustrated as dynamic random access memories (DRAM), other variations of the conventional DRAM devices are contemplated as being suited for use in connection with the invention, such as fast page mode, extended data out (EDO), and BEDO DRAMs, as well as synchronous DRAMs. In all respects, memory banks $28_0, 28_1, \ldots, 28_{x-1}$ operate in a known manner according to the above-described memory address and control signals.

Figure 3:
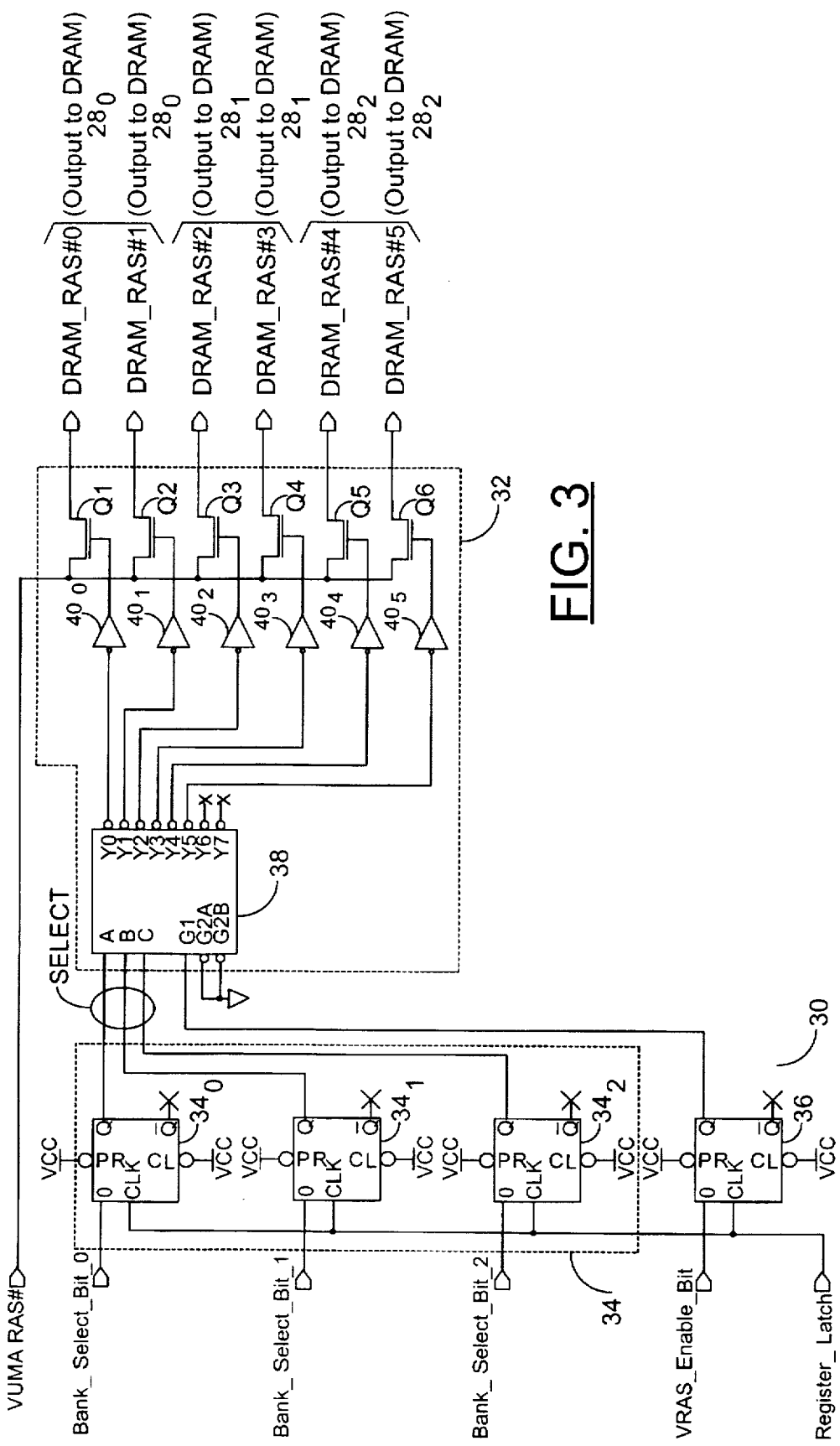
FIG. 3 is a simplified, schematic and block diagram view showing, in greater detail, the preferred embodiment the present invention illustrated in FIG. 2.

FIG. 3 illustrates an embodiment of the present invention implemented in a system having three (3) memory banks $28_0, 28_1,$ and $28_2$. It should be understood, however, that the circuit shown in FIG. 3 is scalable to any number of memory banks. The select signal generating circuit 30 includes a bank select register 34, and a VUMA RAS# enable register circuit 36.

Bank select register 34 comprises at least one, and in the illustrated embodiment, three (3) individual status registers $34_0, 34_1,$ and $34_2$. Bank select register 34 includes a three-line output that collectively defines the SELECT signal (previously referred to) that is representative of the one memory bank selected to receive the VRAS# signal. The registers may be clocked by a clocking signal, such as a register latch signal shown in FIG. 3. The components $34_0, 34_1,$ and $34_2$ are conventional and may be functionally equivalent to commercially available registers.

Enable register circuit 36 is provided for generating an enable signal for enabling mapping means 32 to output the VRAS# signal.

Mapping means 32 includes decoder 38, a plurality of inverting buffers or inverters $40_0, \ldots 40_5$, and pass gate switches Q1–Q6.

Decoder 38 is provided for performing its conventional function of activating a selected one of the outputs Y0–Y5 according to the three-bit select signal SELECT provided to inputs labeled A, B, and C. Each of the output terminals Y0–Y5 corresponds to one of the memory banks $28_i$. Decoder 38, however, must be enabled by way of the VRAS enable signal from register 36 in order to activate the selected output. In the illustrated embodiment, decoder 38 is conventional, and may function equivalently to the commercially available CY54/74FCT138T.

Inverters $40_0$–$40_5$ are conventional and perform their usual function, and may be equivalent to well-known, commercially available parts.

Pass gates Q1–Q6 are also conventional. Each pass gate includes a first terminal connected to the VUMA device RAS# signal, vAS#, a second terminal respectively coupled to the memory banks $28_i$, and a control gate respectively coupled to the decoder 38 outputs Y0–Y5 by way of the inverting buffers $40_0$–$40_5$.

In operation, the VUMA RAS# signal is physically mapped to an appropriate DRAM RAS#x signal by way of switching pass gates Q1–Q6. These pass gates Q1–QG are, in turn, switched by the output signals Y0–Y5 of 8-bit decoder 38. The decoder 38, in turn, changes its output based on the status of registers $34_0$, $34_1$, $34_2$, and 36. These register bits (e.g., bank_select_bit_0, bank_select_bit_1, bank_select_bit_2, and VRAS enable bit) are programmable by BIOS with a minimum of firmware modification. For example, the illustrated hardware implementation can be embedded in a memory controller, such as memory controller 24, that supports the VUMA specification, with very little hardware modification.

Figure 4:
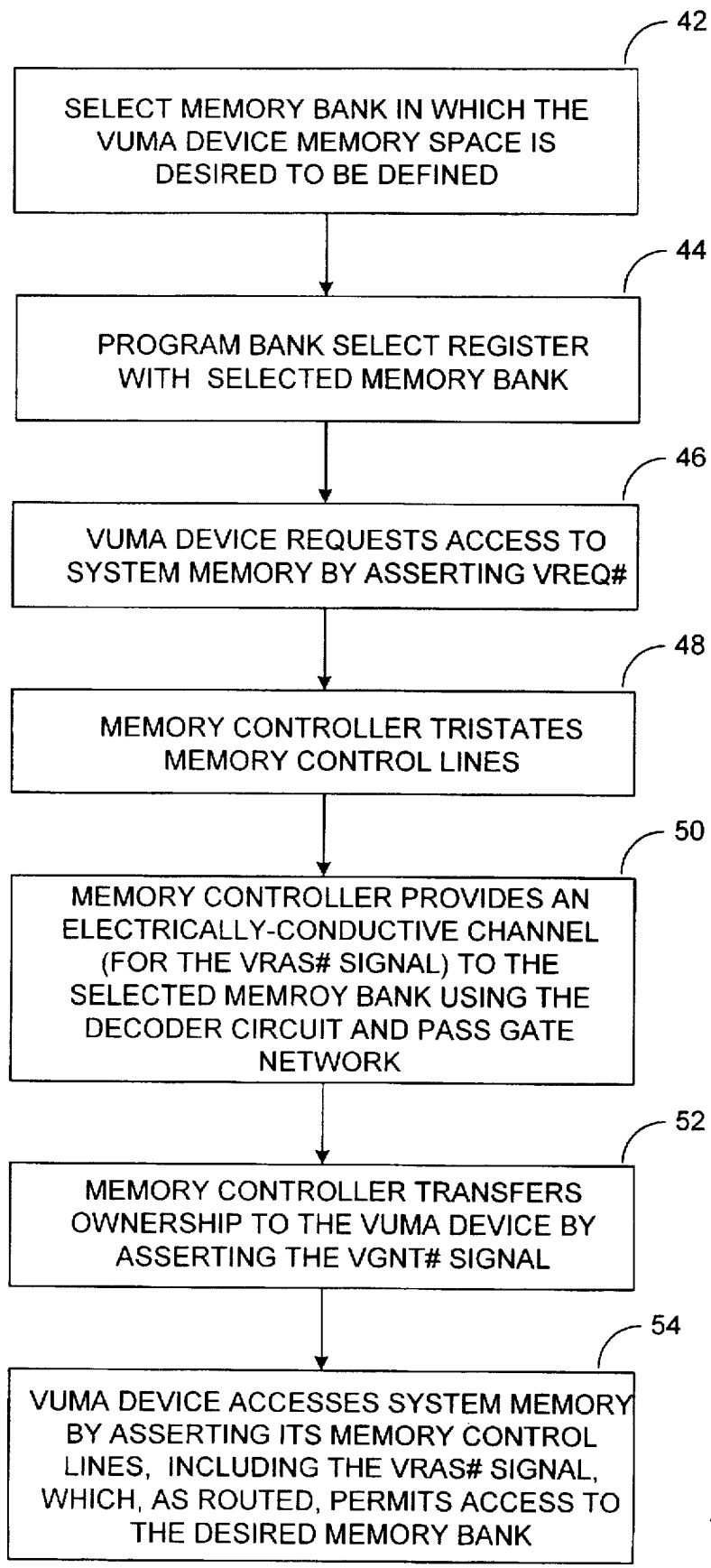
FIG. 4 is a flow chart diagram illustrating the operation of the present invention in a preferred environment.

Referring now to FIG. 4, an overall description of the operation of the present invention will be set forth. In step 42, the memory bank into which the VUMA device memory space (e.g., main VUMA memory) is desired to be mapped is selected. This selection may be done by BIOS in response to a request by a VUMA device for such allocation, with due consideration given to whether the system has one or more memory banks due to, for example, expansion of the original physical system memory 28.

In step 44, the memory controller, in particular the bank select register 34, is programmed with, or, more particularly, is programmed to drive the memory bank selected in step 42, using the VUMA device 26 RAS# signal, as routed through mapping means 32.

In step 46, VUMA device 26 requests access to physical system memory 28 by asserting the request signal VREQ#.

In step 48, memory controller 24, in response to the request for access to memory 28 by VUMA device 26, tristates (i.e., high impedance state) all of its memory control lines to thereby preclude generation of the memory control signals.

In step 50, memory controller 24 provides an activated channel (electrically-conductive) for the VRAS# signal to the selected memory bank by way of pass gate network Q1–Q6, activated as described above, using, among other signals, the bank selection bits. Note that in order for a channel to exist in which the VRAS# signal may be routed, the VRAS-enable-bit must be asserted, and all of the registers clocked by the register latch signal.

In step 52, memory controller 24 transfers ownership of system memory 28 to VUMA device 26 by asserting the grant signal VGNT#.

In step 54, VUMA device 26 accesses system memory 28 (upon receipt of the grant signal VGNT#) by driving its memory control signals, including the VRAS# signal. The VRAS# signal, as routed, thus accesses the desired memory bank $28_i$. The above-described technique may minimize the usage of external termination resistors because the pass gate resistance of each of pass gates Q1–Q6 may also serve the function of a termination resistor.

This aspect of the present invention may be conveniently implemented using a conventional general purpose digital computer programmed according to the teachings of the present specification, as will be apparent to those skilled in the art. Appropriate software coding can readily be prepared by skilled programmers based on the teachings of the present disclosure, as will be apparent to those skilled in the art.

The invention may also be implemented by the preparation of application specific integrated circuits or by interconnecting an appropriate network of conventional components as described herein, modifications of which will be readily apparent to those skilled in the art.

The present invention thus also includes a computer program product which may comprise a storage medium including instructions which can be used to program a computer to perform a process of the invention. The storage medium can include, but is not limited to, any type of disk including floppy disks, optical disks, CD-ROMs, and magneto-optical disks, ROMs, RAMs, EPROMs, EEPROMs, magnet or optical cards, or any type of media suitable for storing electronic instructions.

The present invention includes a method of defining a device memory space, such as a VUMA device memory space, by mapping a device RAS# signal, such as a VUMA RAS# signal, from the device to the appropriate memory bank. An embodiment according to this invention has the advantage of only requiring a minimum of hardware modification to the memory controller for implementation; in a preferred embodiment, only an 8-bit decoder, four (4) registers, six (6) inverters, and six (6) pass gates are needed to implement a design with a three (3) memory bank configuration (e.g., main memory, remainder memory and extended memory). Furthermore, another advantage of the present invention is that a minimum amount of firmware modification may be employed. In particular, main VUMA memory of a VUMA device can be physically mapped to an appropriate memory bank by programming corresponding registers with existing information about memory configuration. Moreover, as an additional advantage of the present invention, there may be no gate delay involved in propagating the Row Address Strobe to the desired memory bank because the conductive channel is set up before the VUMA device attempts access to memory 28, and further, because the pass gates insert no substantial "gate" delay. Finally, pass gate resistance may also perform the function of a termination resistor, thus eliminating a need for the latter.

While the invention has been particularly shown and described with reference to the preferred embodiments thereof, it is well understood by those skilled in the art that various changes and modifications can be made in the invention without departing from the spirit and scope of the present invention, which is limited only by the appended claims. For example, although many of the control signals were described as being active-low, it should be appreciated that complementary logic employing active-high signal levels is fully within the spirit and scope of this invention.

I claim:

1. A mapping circuit comprising:
   a first circuit configured to generate a select signal representative of one of a plurality of memory banks selected to receive a device row address strobe (RAS) signal from a device using the memory bank, said memory bank being responsive to a memory RAS signal for access thereto; and
   a second circuit configured to selectively map the device RAS signal to the memory bank in accordance with said select signal, said second circuit comprising:
   (i) a decoder circuit having a plurality of output terminals corresponding to the memory banks, wherein said decoder circuit is capable of activating one of said output terminals according to said select signal; and
   (ii) a plurality of pass gates each having a first terminal connected to the device RAS signal, a second terminal respectively coupled to the memory banks, and a control gate respectively coupled to said decoder circuit output terminals, wherein one of said pass gates is capable of transferring the device RAS signal to the selected memory bank according to said select signal.

2. The mapping circuit of claim 1, wherein said device is one of a plurality of devices sharing said memory bank.

3. The mapping circuit of claim 1 wherein said first circuit includes a bank select register having an output that collectively defines said select signal.

4. The mapping circuit of claim 3 wherein said bank select register comprises a programmable input for varying the selection of the memory bank selected to receive the device RAS signal.

5. The mapping circuit of claim 3 further including a device RAS enable register circuit capable of generating an enable signal for enabling said second circuit.

6. A memory controller comprising the mapping circuit of claim 1, wherein said first circuit comprises a bank select register having an output that collectively defines said select signal.

7. The memory controller of claim 6 further including a device RAS enable register circuit for generating an enable signal for enabling activation of said one decoder output.

8. The memory controller of claim 7 wherein said memory banks comprises one or more dynamic random access memory (DRAM) devices.

9. The memory controller of claim 8 wherein at least one of said DRAM devices comprises an extended data out (EDO) DRAM.

10. The memory controller of claim 8 wherein at least one of said DRAM devices comprises a synchronous DRAM.

11. The memory controller of claim 7 wherein said bank select register comprises a programmable input for varying the selection of the memory bank selected to receive the device RAS signal.

12. The memory controller of claim 11, further comprising a master memory bus connecting said device to said memory bank.

13. The memory controller of claim 12, wherein said device is one of a plurality of devices, and said memory bank is one of a plurality of memory banks.

14. The memory controller of claim 12, further comprising:
    a third circuit configured to generate a bus request signal, and
    a fourth circuit configured to generate a bus grant signal, wherein a selected device drives said master memory bus in accordance with said bus request signal and said bus grant signal.

15. A method of accessing memory, comprising:
    inputting a device row address strobe (RAS) signal from a device into a means for mapping memory;
    outputting a memory RAS select signal from said memory mapping means to said memory, said memory being responsive to the memory RAS signal for access thereto;
    decoding a plurality of output terminals corresponding to the memory banks, wherein said decoding activates one of said output terminals according to said select signal; and
    transferring the device RAS signal to the selected memory bank according to said select signal in response to a plurality of pass gates each having a first terminal connected to the device RAS signal, a second terminal respectively coupled to the memory banks, and a control gate respectively coupled to said decoder circuit output terminals.

16. The method of claim 15, wherein said device is a video device.

17. The method of claim 16, wherein said memory comprises a plurality of memory banks.

18. The method of claim 15, further comprising, prior to said outputting step, the steps of:
    generating one or more memory RAS signals other than said memory RAS select signal; and,
    generating said device RAS signal.

19. A circuit comprising:
    means for generating a select signal representative of one of a plurality of memory banks selected to receive a device row address strobe (RAS) signal from a device, said memory bank being responsive to a memory RAS signal for access thereto; and
    means for selectively mapping the device RAS signal to the memory bank in accordance with said select signal, said mapping means comprising:
    (i) a decoder circuit having a plurality of output terminals corresponding to the memory banks, wherein said decoder circuit is capable of activating one of said output terminals according to said select signal; and
    (ii) a plurality of pass gates each having a first terminal connected to the device RAS signal, a second terminal respectively coupled to the memory banks, and a control gate respectively coupled to said decoder circuit output terminals, wherein one of said pass gates is capable of transferring the device RAS signal to the selected memory bank according to said select signal.

20. The circuit of claim 19, wherein said device is one of a plurality of devices sharing said memory bank.

21. The circuit of claim 19 wherein said select signal generating means includes a bank select register having an output that collectively defines said select signal.

22. The mapping circuit of claim 21 wherein said bank select register comprises a programmable input for varying the selection of the memory bank selected to receive the device RAS signal.

23. The mapping circuit of claim 21 further including a device RAS enable register circuit capable of generating an enable signal for enabling said second circuit.

* * * * *